United States Patent [19]
Kuhn et al.

[11] 3,964,157
[45] June 22, 1976

[54] METHOD OF MOUNTING SEMICONDUCTOR CHIPS

[75] Inventors: Matthew Kuhn, Manotick, Canada; Norman Edwin Schumaker, North Plainfield, N.J.

[73] Assignee: Bell Telephone Laboratories, Incorporated, Murray Hill, N.J.

[22] Filed: Oct. 31, 1974

[21] Appl. No.: 519,594

[52] U.S. Cl. ............................. 29/591; 29/576 R; 357/17
[51] Int. Cl.² ........................................ H01L 21/00
[58] Field of Search ............ 29/591, 590, 576 S, 29/577, 626, 580, 589; 357/17

[56] References Cited
UNITED STATES PATENTS

| | | | |
|---|---|---|---|
| 3,325,882 | 6/1967 | Chiou | 29/576 S |
| 3,374,537 | 3/1968 | Doelp | 29/576 S |
| 3,484,534 | 12/1969 | Kilby | 29/576 S |
| 3,694,902 | 10/1972 | Apgar | 29/591 |
| 3,745,648 | 7/1973 | Wiesner | 29/580 |
| 3,816,847 | 6/1974 | Nagao | 357/17 |

*Primary Examiner*—Victor A. DiPalma
*Attorney, Agent, or Firm*—L. H. Birnbaum

[57] ABSTRACT

Disclosed is a bonding and packaging scheme for semiconductor device chips with particular application to semiconductor monolithic display chips. The display chip is bonded face down in a recess formed in a transparent substrate. In one embodiment, the metallization on the chip is aligned and made coplanar with the auxiliary metallization on the substrate, and the gap between the metallizations is bridged by a conductive material. This can be accomplished, for example, by solder reflow or epoxy bonding techniques. In an alternative embodiment, the metallization is formed after the chip is bonded to the substrate utilizing a coating which fills the gap between the chip and the substrate. The substrate may be dyed to act as a contrast filter, and a magnifying lens may be molded thereon in further processing.

12 Claims, 8 Drawing Figures

METHOD OF MOUNTING SEMICONDUCTOR CHIPS

BACKGROUND OF THE INVENTION

This invention relates to packaging of semiconductor chips and, in particular, chips comprising light emitting displays.

At present, there is considerable activity in developing monolithic structures for GaP numeric and alphanumeric displays. A typical numeric comprises seven electrodes in the form of bars arranged in a figure-eight configuration such that different combinations of electrodes will display all numerals from 0–9. These electrode segments require interconnections to auxiliary circuitry such as the necessary logic circuits and power supply. Present schemes for packaging such displays typically involve placing the display chip on a ceramic substrate including the auxiliary circuitry and making the necessary electrical connections by means of beam leads or wire bonding procedures. Beam lead bonding is a fairly complicated technology involving formation of several layers of metal. Wire bonding is simpler but usually requires many more individual wire bonds.

In addition to interconnect and bonding problems, a further problem associated with present schemes is the need for a colored filter over the display chip to provide contrast under ambient lighting conditions. This requires an additional piece part in the display package.

It is therefore a primary purpose of the invention to provide an inexpensive packaging scheme which reduces the number of piece parts and the number of handling steps required to interconnect the display chip with auxiliary circuitry. While the present disclosure is directed primarily to the formation of display packages, it should become clear that the inventive features may also be applied to bonding and mounting of other types of semiconductor chips.

SUMMARY OF THE INVENTION

In accordance with the invention, the display chip is placed in a recess formed in a transparent substrate. In one embodiment, the previously formed metallization on the chip and on the substrate are aligned and conductive bridges are formed over the gap. This can be accomplished by a solder reflow or epoxy bonding procedure. In an alternative embodiment, the metallization is formed subsequent to the placement of the chip in the substrate with an appropriate material filling the gap to provide support for the metal. In either case, the display is viewed through the substrate and appropriate coloring may be supplied therein so that the substrate itself acts as a filter. The substrate may further be molded to form a lens for magnification.

BRIEF DESCRIPTION OF THE DRAWING

These and other features of the invention are delineated in detail in the description to follow. In the drawing.

It will be appreciated that for purposes of illustration these figures are not made to scale.

DETAILED DESCRIPTION OF THE INVENTION

Figure 1:
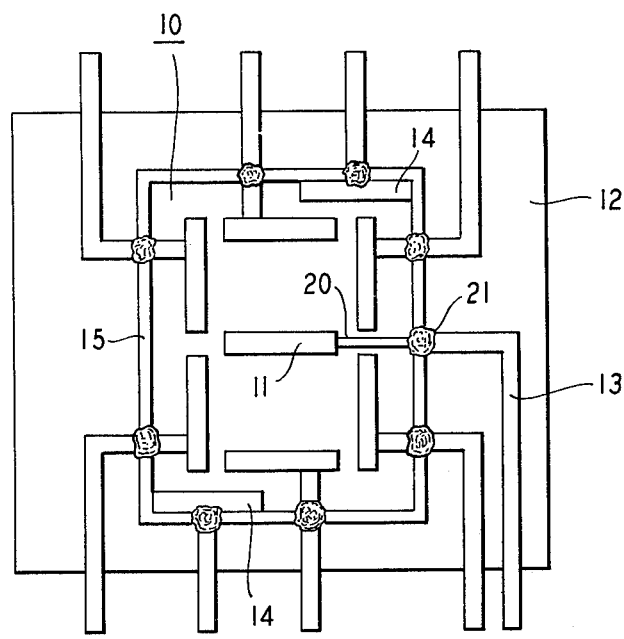
FIG. 1 is a plan view of a display package in accordance with one embodiment of the invention.

FIG. 1 illustrates a display package which may be manufactured in accordance with the invention. The display chip, 10, has formed thereon electrodes such as 11, which are arranged in a figure-eight pattern to form a desired numeral when the appropriate combination of electrodes is biased. Typically, the display chip, as shown in FIG. 2B–2C, comprises a GaP substrate, 16, of n-type conductivity upon which is grown, usually by liquid phase epitaxy, a layer of $n^+$-type GaP 17. A second layer of p-type GaP, 18, is formed over this layer, again by standard liquid phase epitaxial techniques, and then etched to form mesas in the seven-bar format to define the display segments. An insulating layer, 19, is grown over appropriate areas of the surface, and the electrodes, such as 11, are formed over the mesas along with their associated conduction paths 20 to permit voltages to be supplied to the p-type regions 18. Referring back to FIG. 1, metal layers 14 are also provided to make ohmic contact to the n-type layer. Of course, the display chip described herein is given by way of example, and any other type of display chip may utilize the inventive features. For example, the display may comprise a sixteen-bar format alpha-numeric array. Further, a planar rather than mesa geometry may be employed wherein the segments are defined by the electrodes themselves or by diffused junctions.

Referring back to FIG. 1, it will be seen that auxiliary metallization, such as conduction path 13, is disposed on transparent substrate 12. The gap between the metallization on the chip and on the substrate is bridged by conductive material such as, in this example, solder 21. The metallization 13 extends out beyond the edges of substrate 12 for electrical connection to outside circuitry. Alternatively, the metallization may terminate on the substrate in the form of bonding pads so that connection to the outside may be made by pins or wire bonding.

Figure 2A:
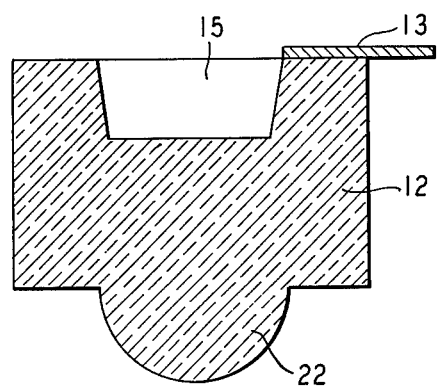
FIGS. 2A–2D are cross-sectional views of a display package in various stages of manufacture in accordance with the same embodiment.
Figure 2B:
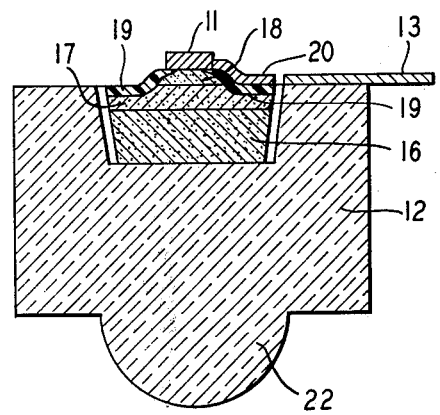
Figure 2C:
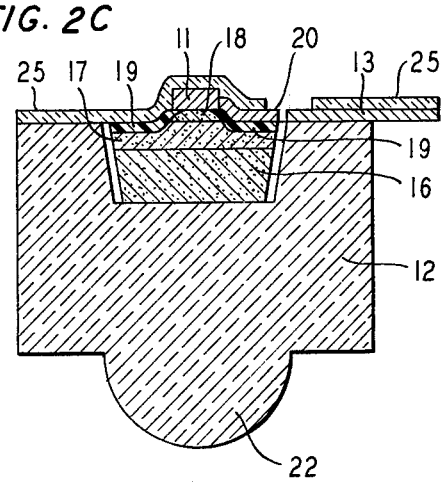
Figure 2D:
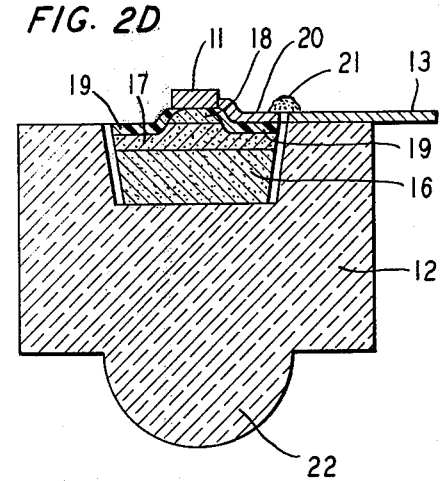

The method of formation of this display package can best be understood from the sequence of events illustrated in FIGS. 2A–2D, wherein elements corresponding to FIG. 1 are similarly numbered. As shown in FIG. 2A, a depression, 15, is formed in the substrate 12. Since the substrate may conveniently be made of a transparent glass or plastic, the depression may be formed by the mold used in fabricating the substrate. Alternatively, the depression can be made by standard hot-pressing or photolithographic etching techniques. A hemispherical lens, 22, may optionally be provided on the opposite side of the substrate over the area of the depression to magnify the size of the display. This piece may also be molded out of the substrate. If desired, the substrate may serve not only as a support for the chip but also as a filter element, since in the final package the chip will be viewed through the substrate. Thus, utilizing standard techniques known in the art, the substrate may be dyed red or green for red or green light emitting displays, respectively, in order to provide the contrast which in most other packages was obtained by a separate filter element.

The conduction paths, such as 13, are deposited on the substrate by standard techniques, such as hot filament evaporation, as close to the edge of the recess as possible. The metallization typically comprises gold but other conductors may be utilized if desired. Also, the gold layer may be covered by an additional layer of metal which is easily wetted by solder. Tin was found to be effective for this purpose, but other metals such as nickel and silver would also be suitable.

As illustrated in FIG. 2B, the completed display chip, previously described, is placed in the recess "face down", that is, with the light emitting surface at the bottom and the metallized surface facing up. The metallization on the chip has already been formed, again by standard techniques such as hot-filament evaporation. The recess in the substrate has a depth which makes the metallization on the chip and the metallization on the substrate essentially coplanar at the edges. The chip is also positioned so that the conduction paths of the chip line up with their associated conduction paths on the substrate, as is seen more clearly in the plan view of FIG. 1. The chip is bonded into the recess of the substrate with a droplet of clear adhesive, such as a pressure sensitive alpha cyanoacrylate.

Figure 3:
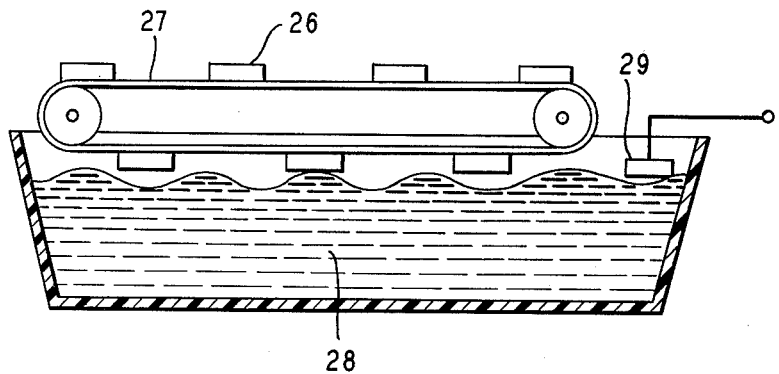
FIG. 3 is a schematic illustration of an apparatus used for one step of fabricating the display package in accordance with the same embodiment.

Of course, the metallizations on the chip and substrate are normally separated by a small gap. This gap may be bridged in accordance with this embodiment by a wave solder reflow process. As shown in FIG. 2C, a photoresist layer, 25, is first formed over the metallized surface of the chip and substrate while the areas where bridges are desired are exposed. The device may then be incorporated in a solder reflow apparatus of the type illustrated schematically in FIG. 3. The devices, illustrated as blocks, 26, are secured to conveyer belt 27 which is positioned to pass the devices over a bath containing liquid solder 28. Solder is understood to be a metal or metallic alloy which when melted can be used to join metallic surfaces. The solder is usually an alloy of Sn and Pb in varying proportions. One example for this purpose is an alloy of three parts Sn and two parts Pb. Means, such as vibrating bar 29, produce waves in the bath so that the surface of the devices are periodically struck by the solder as they pass over. Due to the inherent surface tension of the metallization on the solder, this wetting of the exposed metal surfaces forms a conductive bridge across the gap. Thus, after the solder reflow process and stripping away of the photoresist, the display package illustrated in cross-section in FIG. 2D and in the plan view of FIG. 1 results. The conductive bridges are illustrated as regions 21.

After the interconnects are made, the package may be further processed by overcoating with a plastic encapsulant to protect the display from ambient conditions in accordance with known procedures.

An important feature of the invention, as mentioned above, is the utilization of surface tension to form a conductive bridge between metallizations. The width of the gap between chip and substrate metallization, as well as the width of the metallizations themselves, are therefore important considerations in achieving adequate surface tension. It is believed that optimum conditions are a separation of 2 mils or less between metallization and a metal width of at least 8 mils. In general, the separation may be in the range 1 – 3 mils, while the width of the conduction paths can be in the range 6 – 12 mils for adequate results.

The conductive bridge may be formed by means other than the wave solder reflow process. For example, with the photoresist in place, the solder could be poured over the surface. Further, the gaps may be bridged by simply applying a conductive epoxy to the desired areas with a standard dispensing apparatus. One class of useful epoxies is the standard glycidly-ether epoxies filled with Ag or Au. In addition, dielectrics such as $SiO_2$ could be used as masks in place of the photoresist.

Figure 4A:
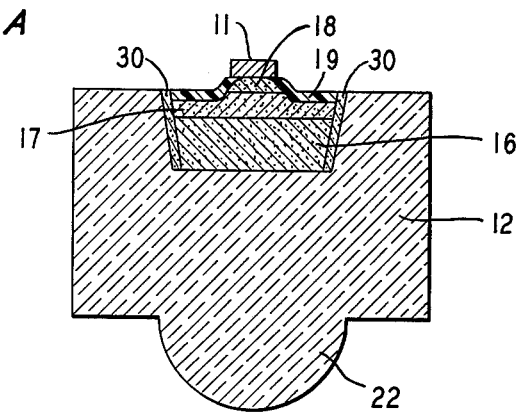
FIGS. 4A–4B are cross-sectional views of a display package in different stages of manufacture in accordance with a further embodiment of the invention.
Figure 4B:
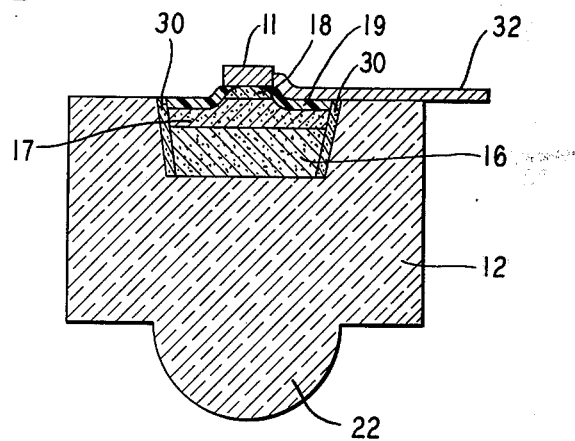

An alternative embodiment, which does not require solder or epoxy bridges, is illustrated in FIGS. 4A–4B with elements corresponding to FIGS. 2A–2D similarly numbered. As in the previous embodiment, a recess is formed in transparent substrate 12 and the display chip, 10, is inserted therein so that the edge of the chip and substrate are essentially coplanar. In this example, however, although the electrodes, 11, have been deposited, the conduction paths on chip and substrate have not yet been formed. Further, the chip is bonded into the recess by an adhesive, 30, such as a transparent cycloaliphatic epoxy with anhydride curing agents, which completely fills the gap and forms a continuous bridge between the chip and the substrate. Thus, standard metal evaporation or sputtering is then employed to form continuous metal conduction paths, such as 32, overlying the chip and substrate to electrically couple the associated chip electrode to the outside as illustrated in FIG. 4B.

It will be appreciated that the processing of a single display chip is described for purposes of illustration. A substrate may incorporate several such chips to form a package comprising a line of characters. In addition, the substrate may include the logic circuitry needed to bias the display. In fact, the logic circuitry which usually comprises one or more silicon integrated circuit chips, may be formed in recesses and interconnected with the display chips by means of substrate metallization in the same manner as that described for the display chips.

Various additional modifications and extensions of the invention will become apparent to those skilled in the art. All such variations which basically rely on the teachings through which the invention has advanced the art are properly considered within the spirit and scope of the invention.

What is claimed is:

1. A method of mounting a semiconductor chip structure including a first set of conductor paths thereon onto an insulating substrate comprising the steps of:

forming a recess in said insulating substrate;

forming a second set of conduction paths on the surface of said substrate extending to the edge of the recess;

bonding said chip structure into said recess so that the set of conduction paths on the chip are aligned with associated conduction paths on the substrate and the conduction paths are essentially co-planar at the edges of the chip and substrate, thereby forming a gap between the associated conduction paths; and applying to said associated conduction paths a liquid conducting material which is different from the material of the conduction paths and which is unsupported by any material in the gap such that the surface tension exerted by each pair of associated conduction paths on the liquid forms a conductive bridge over the gap between said pair of associated conduction paths.

2. The method according to claim 1 wherein the gap between associated conduction paths of the two sets of conduction paths has a width within the range of 1 – 3 mils.

3. The method according to claim 1 wherein the width of the conduction paths at the edges of the gap is within the range 6 – 12 mils.

4. The method according to claim 1 wherein the bridges are formed by wetting the conduction paths at the edges of the gap with a liquid solder.

5. The method according to claim 1 wherein the bridges are formed by depositing conductive epoxy on the conduction paths at the edges of the gap.

6. A method of mounting a semiconductor chip comprising a light emitting display including a first set of conduction paths thereon comprising the steps of:

forming a recess in a transparent insulating substrate;

forming a second set of conduction paths on the surface of said substrate extending to the edge of the recess;

bonding said display chip into said recess with the light emitting surface facing the bottom of the recess so that the set of conduction paths on the chip are aligned with associated conduction paths on the substrate and the conduction paths are essentially coplanar at the edges of the chip and substrate, thereby forming a gap between the associated conduction paths; and applying to said associated conduction paths a liquid conducting material which is different from the material of the conduction paths and which is unsupported by any material in the gap such that the surface tension exerted by each pair of associated conduction paths on the liquid forms a conductive bridge over the gap between said pair of conduction paths.

7. The method according to claim 6 wherein the gap between the associated conduction paths has a width within the range of 1 – 3 mils.

8. The method according to claim 6 wherein the width of the conduction paths at the edges of the gap is within the range 6 – 12 mils.

9. The method according to claim 6 wherein the bridges are formed by wetting the conduction paths at the edges of the gap with a liquid solder.

10. The method according to claim 6 wherein the bridges are formed by depositing conductive epoxy on the conduction paths at the edges of the gap.

11. The method according to claim 6 wherein the substrate is dyed so as to provide a contrast filter for the light emitted by the display.

12. The method according to claim 6 wherein a portion of the surface of the substrate opposite to the recess is formed in the shape of a hemispherical lens in order to magnify the size of the display.

* * * * *